(12) United States Patent
Kikuchi

(10) Patent No.: US 9,105,553 B2
(45) Date of Patent: Aug. 11, 2015

(54) SOLID-STATE IMAGING APPARATUS WITH PLURAL CURRENT SOURCE CIRCUITS

(71) Applicant: CANON KABUSHIKI KAISHA, Tokyo (JP)

(72) Inventor: Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 285 days.

(21) Appl. No.: 13/679,520

(22) Filed: Nov. 16, 2012

(65) Prior Publication Data

US 2013/0140435 A1   Jun. 6, 2013

(30) Foreign Application Priority Data

Dec. 2, 2011   (JP) .................................. 2011-264512

(51) Int. Cl.
| | |
|---|---|
| H01L 27/00 | (2006.01) |
| H04N 5/335 | (2011.01) |
| H01L 27/148 | (2006.01) |
| H04N 3/14 | (2006.01) |
| H04N 5/365 | (2011.01) |
| H04N 5/378 | (2011.01) |

(52) U.S. Cl.
CPC .......... *H01L 27/14806* (2013.01); *H04N 3/155* (2013.01); *H04N 5/365* (2013.01); *H04N 5/3658* (2013.01); *H04N 5/378* (2013.01)

(58) Field of Classification Search
USPC ................ 250/208.1, 369; 348/294, 300–308
See application file for complete search history.

(56) References Cited

U.S. PATENT DOCUMENTS

| | | | |
|---|---|---|---|
| 5,245,203 A | 9/1993 | Morishita et al. | 257/113 |
| 7,321,110 B2 | 1/2008 | Okita et al. | 250/208.1 |
| 7,408,210 B2 | 8/2008 | Ogura et al. | 257/233 |
| 7,456,888 B2 | 11/2008 | Kikuchi | 348/308 |
| 7,460,162 B2 | 12/2008 | Koizumi et al. | 348/294 |
| 7,550,793 B2 | 6/2009 | Itano et al. | 257/239 |
| 7,554,591 B2 | 6/2009 | Kikuchi et al. | 348/308 |
| 7,659,500 B2 * | 2/2010 | Purcell | 250/208.1 |
| 7,907,196 B2 | 3/2011 | Ogura et al. | 348/308 |
| 8,045,034 B2 | 10/2011 | Shibata et al. | 348/308 |
| 8,174,600 B2 | 5/2012 | Ogura et al. | 348/301 |
| 2010/0231767 A1 | 9/2010 | Kikuchi | 348/301 |
| 2011/0157441 A1 | 6/2011 | Okita et al. | 348/301 |
| 2012/0006993 A1 | 1/2012 | Arishima et al. | 250/369 |
| 2012/0007197 A1 | 1/2012 | Kikuchi et al. | 257/429 |
| 2012/0007203 A1 | 1/2012 | Kono et al. | 257/435 |
| 2012/0008029 A1 | 1/2012 | Matsuda et al. | 348/300 |
| 2012/0008030 A1 | 1/2012 | Kono et al. | 348/301 |
| 2012/0008031 A1 | 1/2012 | Yamashita et al. | 348/302 |
| 2012/0008177 A1 | 1/2012 | Fujimura et al. | 358/482 |

FOREIGN PATENT DOCUMENTS

JP   2004-165825 A   6/2004

* cited by examiner

*Primary Examiner* — Renee D Chavez
(74) *Attorney, Agent, or Firm* — Fitzpatrick, Cella, Harper & Scinto

(57) ABSTRACT

There is provided a solid-state imaging apparatus that can prevent degradation of image quality. The solid-state imaging apparatus includes a plurality of pixels (1) including a photoelectric conversion element that performs photoelectric conversion; a signal line (6) to which the plurality of pixels output signals; and a first constant current circuit configured to supply a constant current to the signal line, wherein the first constant current circuit has a first transistor (5) having a drain or collector node connected to the signal line, and a first resistor (101) connected between a reference voltage node and a source or emitter node of the first transistor.

14 Claims, 15 Drawing Sheets

SOLID-STATE IMAGING APPARATUS WITH PLURAL CURRENT SOURCE CIRCUITS

BACKGROUND OF THE INVENTION

1. Field of the Invention

The present disclosure relates to a solid-state imaging apparatus.

2. Description of the Related Art

In recent years, as a solid-state imaging apparatus, a CMOS solid-state imaging apparatus including an amplifying element in a pixel in an imaging region has become widespread. The CMOS solid-state imaging apparatus is configured so that each of pixels arranged in a matrix includes a photoelectric conversion element and an amplifying element, and an amplified photoelectric conversion signal is read by a vertical signal line shared by each column. Each vertical signal line has a current source, and the amplifying element that is usually an MOS transistor performs a source follower operation to amplify signals. Japanese Patent Application Laid-Open No. 2004-165825 discloses an example thereof.

However, Japanese Patent Application Laid-Open No. 2004-165825 has a problem as described below. First, a current source circuit connected to each vertical signal line is arranged in one dimension in a horizontal direction. A current supplied by current source circuits of the number of columns is supplied to a ground line, and wiring resistance of the ground line increases a ground potential that is originally 0 V. The increase in the potential may change a gate bias voltage of a MOS transistor that constitutes a current source, and shift an operation point of a pixel source follower. This may degrade linearity of a circuit operation and cause shading of an image.

Second, a gate bias line of a current source circuit (hereinafter referred to as a gate bias line) extends long in a horizontal direction of a screen. Thus, if the solid-state imaging apparatus is used, for example, in a digital camera or a digital video camera, a current due to electromagnetic induction, which is caused by magnetism generated when a lens driving motor near an imaging device is operated, may be supplied to a gate line. The induced current causes variations in gate potential, and changes a pixel output, which may cause noise referred to as "white stripe or smear of a horizontal direction" in an image.

Such a phenomenon has become prominent with remarkable development in sensitivity of a digital camera or a digital video camera in recent years. Specifically, minute potential variations of a gate bias line tend to be viewed as degradation in image quality in high sensitivity setting.

SUMMARY OF THE INVENTION

According to one aspect of the present invention, a solid-state imaging apparatus comprising: a plurality of pixels each including a photoelectric conversion element; a signal line to which the plurality of pixels output signals; and a first current source circuit configured to supply a current to the signal line, wherein the first current source circuit has a first transistor having a drain or collector node capable of being connected electrically to the signal line, and a first resistor electrically connected between a reference voltage node and a source or emitter node of the first resistor.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Expression of "connection" herein may mean electrical connection except in specific cases. Direct connection or connection through an electrical element such as a switch may be allowed.

First Embodiment

Figure 1A:
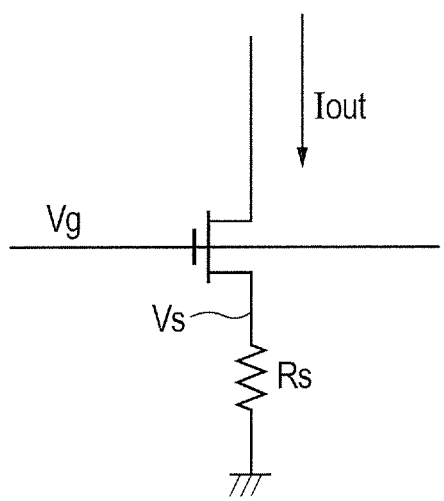
FIGS. 1A and 1B illustrate a concept of a first embodiment.
Figure 1B:
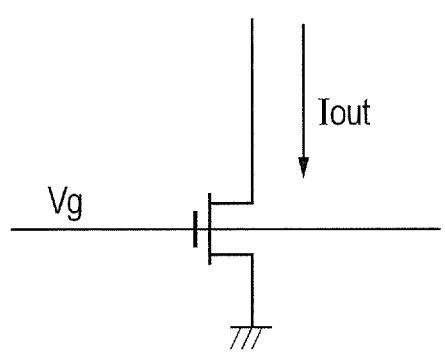

With reference to FIGS. 1A and 1B, an advantage of a source resistor Rs in a current source circuit will be confirmed, and a first embodiment based on the confirmation will be described. FIG. 1A shows a current source circuit with the source resistor Rs, and FIG. 1B shows a current source circuit without the source resistor Rs. The source resistor Rs is a resistor added to a source. An AC component iout of an output current Iout, an AC component vg of a gate voltage Vg of a current mirror MOS transistor, a threshold voltage Vth of a MOS transistor, and a mutual conductance gm are shown.

With the source resistor Rs, as shown in FIG. 1A, the AC component iout of the current Iout supplied by the current source circuit is expressed by Expression (1) below.

Expression 1

$$i_{out} = v_g \frac{1}{\frac{1}{g_m} + R_s} \qquad (1)$$

Without the source resistor Rs, as shown in FIG. 1B, the AC component iout of the current Iout supplied by the current source circuit is expressed by Expression (2) below.

Expression 2

$$i_{out} = v_g g_m \qquad (2)$$

Figure 2:
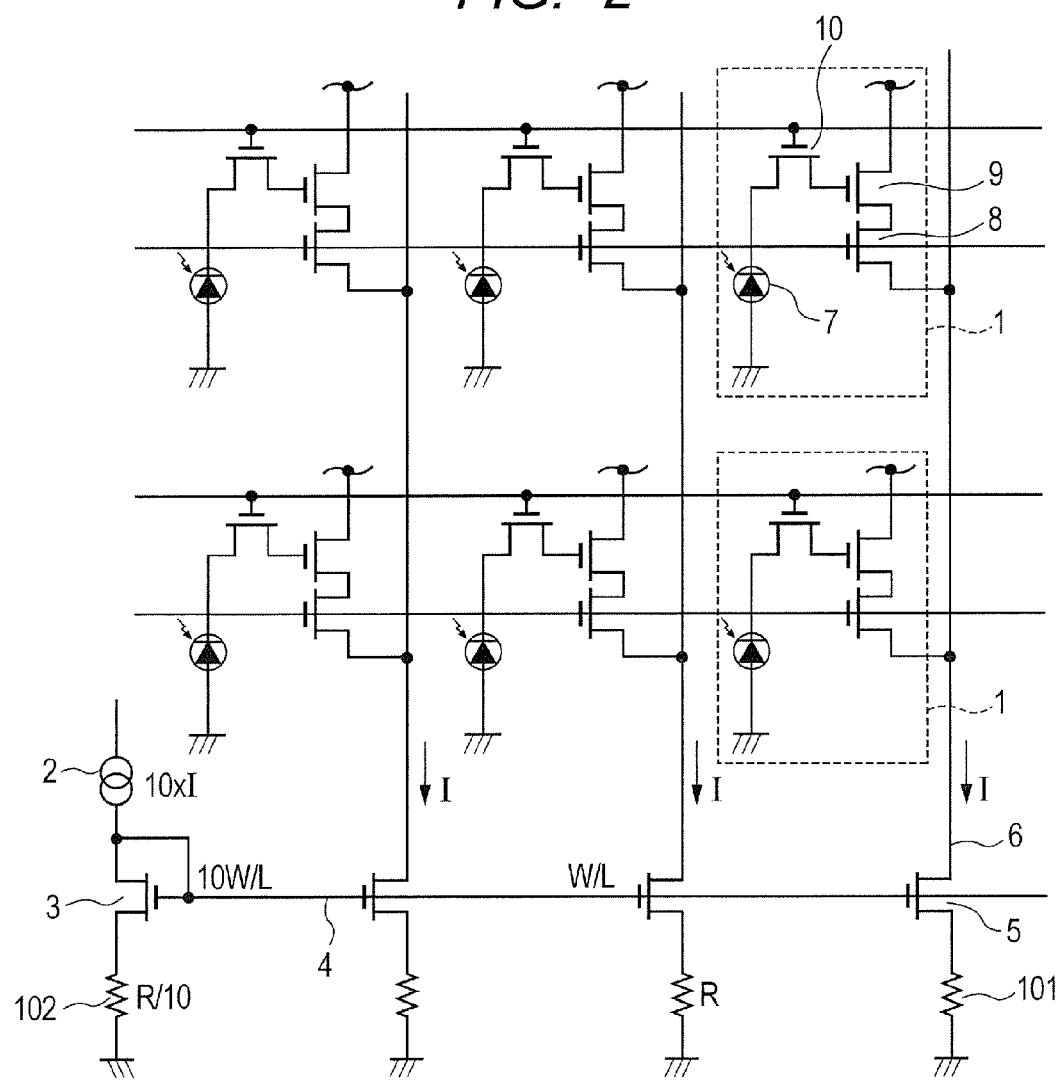
FIG. 2 is a circuit configuration diagram of a solid-state imaging apparatus of the first embodiment.

The "AC component" describes input and output of a small signal amplitude, and may be also referred to as "current change" or "voltage change". Comparing Expressions (1) and (2), it is found that the AC component iout of the current Iout supplied by the current source circuit with respect to variations in the gate voltage Vg, that is, variations in the gate voltage Vg is smaller for a higher resistance value of the source resistor Rs in Expression (1). Thus, the current source circuit with the source resistor Rs advantageously has smaller variations in the current Iout supplied with respect to variations in the gate voltage Vg and a ground potential as compared to the current source circuit without the source resistor Rs. A first embodiment in a case where a concept of the current source circuit in Expression (1) is applied to the solid-state imaging apparatus is illustrated in FIG. 2. The resistor may have at least a higher resistance value than a resistor of a metal wire. Such a resistor can be formed using polysilicon or a diffusion region of a semiconductor.

FIG. 2 illustrates a pixel region of the solid-state imaging apparatus of the first embodiment, and a current source connected to a vertical signal line extending in a pixel column direction of the pixel region. For convenience of description, a plurality of pixels 1 are illustrated only for two columns× three rows, but in the actual solid-state imaging apparatus, there are hundreds to thousands of columns and rows. The solid-state imaging apparatus includes, in addition to the circuit illustrated in FIG. 2, a circuit for amplifying signals output from the vertical signal line (column circuit), a circuit for transfer to a common horizontal output line, and a scanning circuit.

The plurality of pixels 1 are arranged in a two-dimensional matrix. Each pixel 1 includes a photoelectric conversion element 7 (for example, photo diode) that performs photoelectric conversion, a row selecting MOS transistor 8, a pixel source follower MOS transistor 9, and a MOS transistor 10 that transfers charges generated by the photoelectric conversion element 7. The photoelectric conversion element 7 generates signal charges by photoelectric conversion. The MOS transistor 10 transfers the charges generated by the photoelectric conversion element 7 to a gate node of the MOS transistor 9. When the row selecting MOS transistors 8 in a column direction are simultaneously turned on, an output according to a gate potential of the source follower MOS transistor 9 appears in the vertical signal line 6. The plurality of vertical signal lines 6 are each electrically connected to each column of the plurality of pixels 1, and the plurality of pixels 1 output signals. A bias current at that time is I. A current supplied by the first current source 2 is, for example, a current 10×I that is ten times the bias current I. A second transistor 3 is an N-MOS transistor that constitutes a current source. A bias line 4 is provided. A first transistor 5 is an N-MOS transistor that supplies a bias current through the vertical signal line 6 to each pixel 1. The N-MOS transistors 3 and 5 constitute a current mirror circuit, and a current supplied to the vertical signal line 6 is determined by a size ratio between the second transistor 3 and the first transistor 5. In this case, the size ratio is 10:1, thus the current I that is 1/10 of the current supplied by the first current source 2 is supplied by the first transistor 5 to be a bias current of a source follower corresponding to each pixel source follower MOS transistor 9.

A first current source circuit includes the first transistor 5 and a first resistor 101, and the bias current I is supplied to the vertical signal line 6. The first transistor 5 has a drain connected to the vertical signal line 6. The first resistor 101 is connected between a source node of the first transistor 5 and a reference voltage node (ground potential node). A second current source circuit includes the first current source 2, the second transistor 3, and a second resistor 102. The second transistor 3 has a gate node connected to a gate node of the first transistor 5. The second resistor 102 is connected between a source node of the second transistor 3 and a reference voltage node. The first current source 2 is connected to drain and gate nodes of the second transistor 3.

The first resistor 101 is a source resistor added to the source node, and the second resistor 102 is a source resistor connected to the source node of the second transistor 3. The first resistor 101 is a source resistor connected between the source node of the first transistor 5 and the reference voltage node. The second resistor 102 is a source resistor connected between the source node of the second transistor 3 and the reference voltage node. Even when the resistors 102 and 101 are added, mirror properties of a current mirror circuit are established, and a mirror ratio is an inverse number of a supplied current. A resistance ratio between the two resistors 102 and 101 can be set so that a resistance value of the second resistor 102: a resistance value of the first resistor 101=1:10. Specifically, the current supplied by the second transistor (second current source circuit) 3 is M times larger than the current supplied by the first transistor (first current source circuit) 5, and the resistance value of the second resistor 102 is 1/M of the resistance value of the first resistor 101. This is to provide the same source potential of the second transistor 3 and the first transistor 5, and the same source-drain voltage of the N-MOS transistors 3 and 5. The ratio between the first resistor 101 and the second resistor 102 is desirably an inverse number of a current mirror ratio as described above. Even with a shift in the value, current variations caused by variations in the gate voltage Vg can be still reduced.

The resistance value of the first resistor 101 needs to be sufficiently larger than a value of wiring resistance caused by a reference potential line (ground line) connected to the vertical signal line 6 extending in the column direction. The resistance value of the ground line in the column direction differs depending on the number of pixels, a size of a pixel region, and design of the solid-state imaging apparatus. For example, the first resistor 101 desirably has a resistance value of about 10 to 100 kΩ. A magnitude of the bias current I supplied to the vertical signal line 6 also influences the resistance value of the first resistor 101. For example, the bias current I supplied to the vertical signal line 6 is 5 μA to 20 μA, but a voltage value calculated by a product of the current I and the resistance value of the first resistor 101 desirably does not exceed about 0.2 V. This is because a power supply voltage of the circuit in the pixel 1 is 2.5 to 5.0 V, while a potential drop across the first resistor 101 of about 0.2 V or more may influence signal amplitude of the circuit.

Second Embodiment

Figure 3:
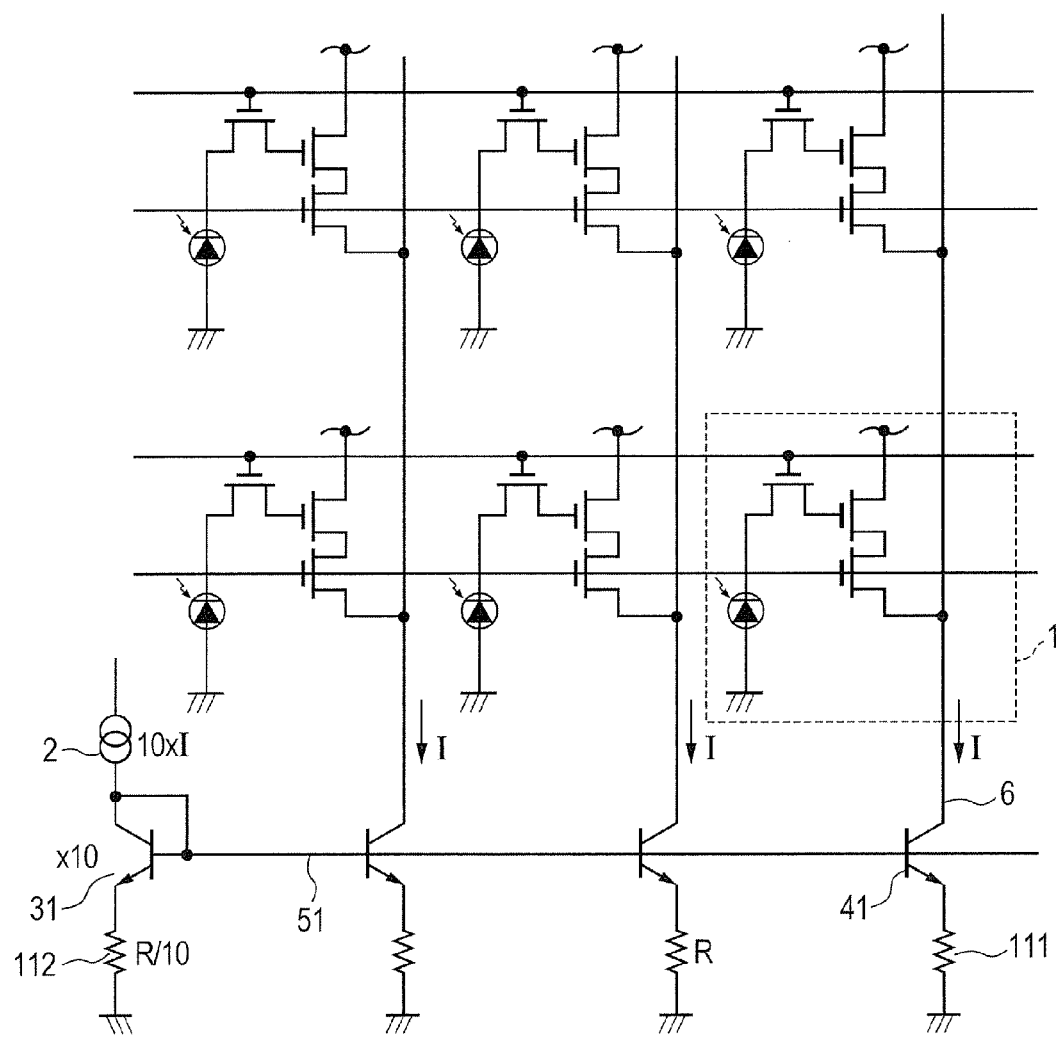
FIG. 3 is a circuit configuration diagram of a solid-state imaging apparatus of a second embodiment.

FIG. 3 illustrates a solid-state imaging apparatus of a second embodiment, partially showing a pixel region and a current source circuit of a vertical signal line 6 as in the first embodiment. In FIG. 3, reference numerals 1, 2, 4, 5 and 6 denote the same components as in the first embodiment, and thus descriptions thereof will be omitted. In this embodiment, a transistor that constitutes the current source circuit is a bipolar transistor. A first current source circuit includes a first transistor 41 and a first resistor 111. A second current source circuit includes a first current source 2, a second transistor 31, and a second resistor 112. The transistors 31 and 41 are bipolar transistors, and the resistors 111 and 112 are emitter resistors. The first transistor 41 has a collector node connected to the vertical signal line 6. The first resistor 111 is connected between an emitter node of the first transistor 41 and a reference voltage node. The second transistor 31 has a base node connected to a base node of the first transistor 41. The second resistor 112 is connected between an emitter node of the second transistor 31 and a reference voltage node. The first current source 2 is connected to collector and gate nodes of the second transistor 31. The second transistor 31 and the second resistor 112 constitute the second current source circuit, and transfers a voltage generated according to the first current source 2 through a bias line 51 to the first transistor 41. The transistor 31 and the resistor 112, and the transistor 41 and the resistor 111 constitute a bipolar current mirror circuit, and a current is supplied in proportion to a ratio between areas of emitters of the bipolar transistors 41 and 31, and an inverse number of a ratio of a resistance value. In FIG. 3, a current supplied by the first current source 2=10×I, and a ratio between elements=10 times, and thus a current I is supplied to the vertical signal line 6.

Figure 4A:
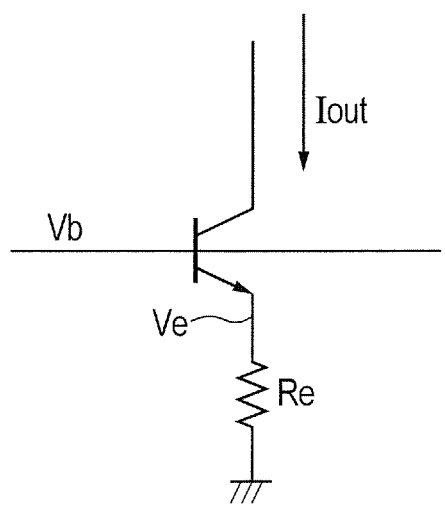
FIGS. 4A and 4B illustrate a concept of the second embodiment.
Figure 4B:
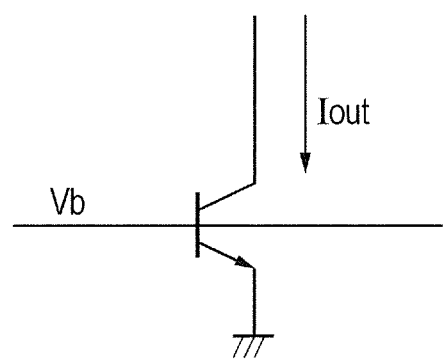

With reference to FIGS. 4A and 4B, an advantage of an emitter resistor will be described. FIG. 4A illustrates a current source circuit with an emitter resistor Re being added, and FIG. 4B illustrates a current source circuit without an emitter resistor Re. As in the case of the MOS transistor, an AC component vb of a base potential Vb, an AC component ve of an emitter potential Ve, the emitter resistor Re, and an AC component iout of a current Iout of the bipolar transistor are shown. Without the emitter resistor Re as in FIG. 4B, the AC component iout of the current Iout is expressed by Expression (3) below, where gmb=q/KT.

Expression 3

$$i_{out} = g_{mb} v_b \quad (3)$$

With the emitter resistor Re as in FIG. 4A, the AC component vb of the base potential is expressed by Expression (4) below.

Expression 4

$$v_b = v_{be} + v_e = \frac{i_{out}}{g_{mb}} + R_e i_{out} \quad (4)$$

From Expression (4), the AC component iout of the current Iout is expressed by Expression (5) below.

Expression 5

$$i_{out} = \frac{v_b}{\frac{1}{g_{mb}} + R_e} \quad (5)$$

This expression represents that the emitter resistor Re suppresses variations in the base potential Vb as in Expression (1). Specifically, even for the current source circuit using the bipolar transistor, the current source circuit with the emitter resistor Re is useful for suppressing current variations caused by potential variations of a bias line 51. A concept of a ratio between resistance values of resistors 111 and 112, and a design method of a magnitude relation between the resistor 111 and a resistor of a ground line of the current source circuit are the same as in the first embodiment. In this embodiment, a pixel using a MOS transistor or a bipolar transistor may be used.

Third Embodiment

Figure 5:
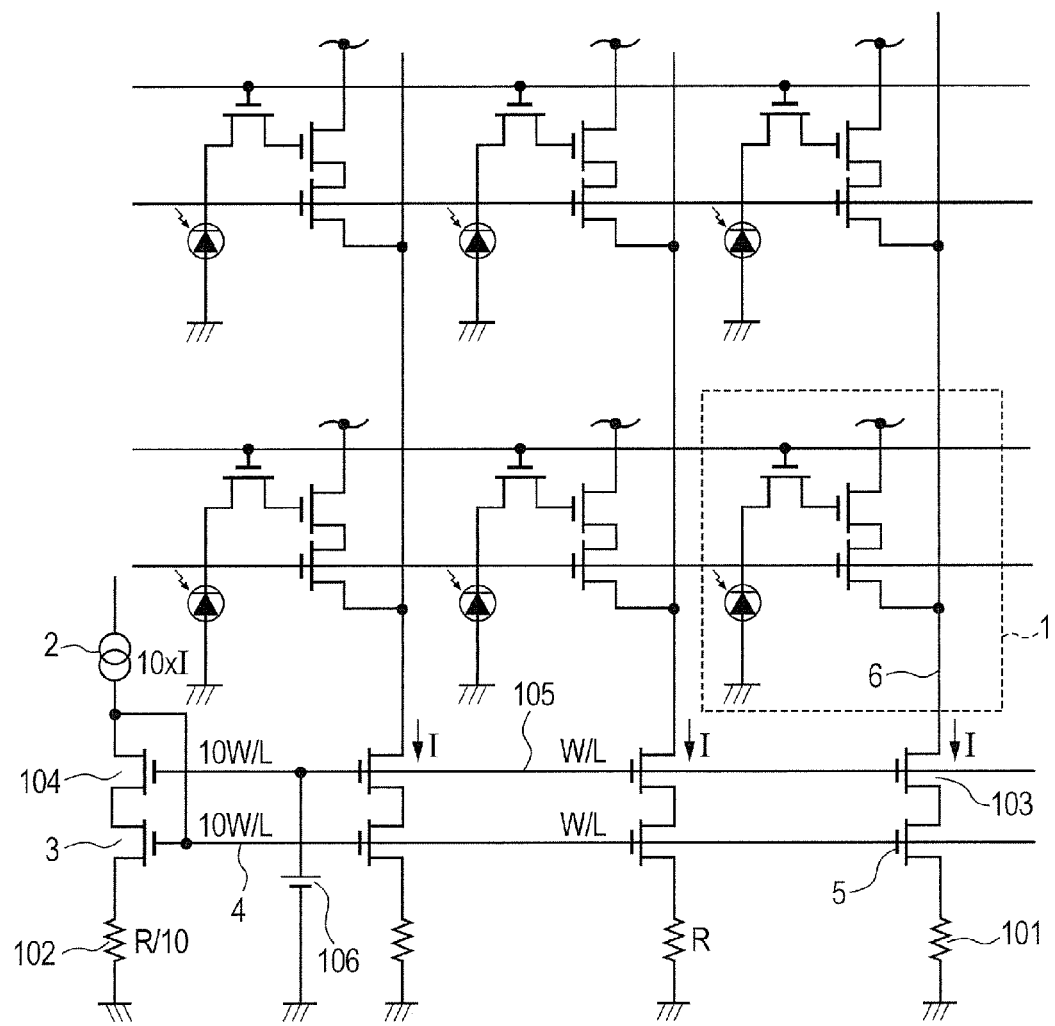
FIG. 5 is a circuit configuration diagram of a solid-state imaging apparatus of a third embodiment.

FIG. 5 is a circuit configuration diagram of a solid-state imaging apparatus of a third embodiment. Reference numerals 1, 2, 4, 5, 6, 101 and 102 denote the same components as in the first embodiment, and thus descriptions thereof will be omitted. In FIG. 5, a second transistor 3 is an N-MOS transistor of a current source, and a common gate amplification N-MOS transistor 104 has a drain node connected to a gate node 4. A similar common gate amplification N-MOS transistor 103 is inserted into a current mirror on a receiving side, thereby suppressing variations in drain voltage of a first transistor 5 and increasing constant current properties and output variation durability. Gate widths of the N-MOS transistor 103 and the N-MOS transistor 104 are at a ratio of 1:10. A voltage source 106 is provided which is a power source for driving a gate line 105 of the N-MOS transistors 103 and 104.

Now, differences of this embodiment from the first embodiment will be described. A first current source circuit includes a first transistor 5, a first resistor 101, and a third transistor 103. The third transistor 103 has a drain node connected to a vertical signal line 6, and a source node connected to a drain node of the first transistor 5. A second current source circuit includes a first current source 2, a second transistor 3, a second resistor 102, and also a fourth transistor 104. The fourth transistor 104 has a gate node connected to a gate node of the third transistor 103, and a source node connected to a drain node of the second transistor 3. The first current source 2 is connected to a gate node of the second transistor 3 and a drain node of the fourth transistor 104. A voltage source 106 is connected to a gate node of the fourth transistor 104.

The N-MOS transistor 104 serves to reduce a phenomenon such that when a potential of an output signal from a pixel 1 decreases and a drain voltage of a driving transistor of the current source circuit decreases, the driving transistor changes from a triode operation to a pentode operation to reduce constant current properties. The common gate amplification transistor is suitable for large variations in signal potential that appears in the vertical signal line 6. The transistors are combined to constitute, as a whole, a circuit with smaller variations of the current source circuit with respect to potential variations of a gate line, and contribute to an increase in image quality of the solid-state imaging apparatus.

Fourth Embodiment

Figure 6:
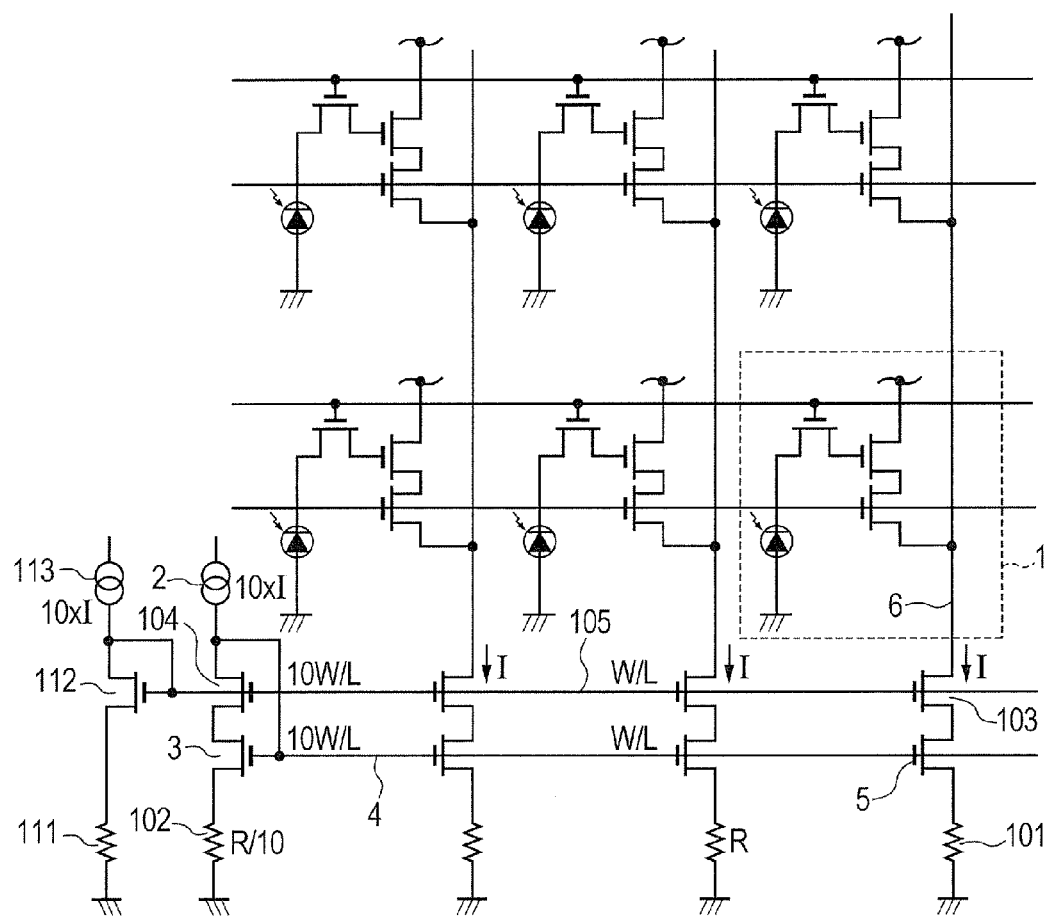
FIG. 6 is a circuit configuration diagram of a solid-state imaging apparatus of a fourth embodiment.

FIG. 6 is a circuit configuration diagram of a solid-state imaging apparatus of a fourth embodiment. Reference numerals 1, 2, 3, 4, 5, 6, 101, 102, 103, 104 and 105 denote the same components as in the third embodiment, and thus descriptions thereof will be omitted. Now, differences of this embodiment from the third embodiment will be described. The voltage source 106 in FIG. 5 is not provided. A fifth transistor 112 is an N-MOS transistor having a drain node connected to a second current source 113, and a gate node connected to the second current source 113 and a gate node of a fourth transistor 104. A third resistor 111 is connected between a source node of the fifth transistor 112 and a reference voltage node. The fifth transistor 112 is an N-MOS transistor for generating a gate voltage of a common gate amplification transistor of the fourth transistor 104. The gate voltage of the common gate amplification transistor 103 is generated by the N-MOS transistor 112, and thus a common gate voltage interlocks with a threshold voltage Vth of the N-MOS transistor. Thus, the common gate amplification transistor 103 stably operates with respect to threshold voltage variations or temperature variations of the MOS transistor.

Fifth Embodiment

Figure 7:
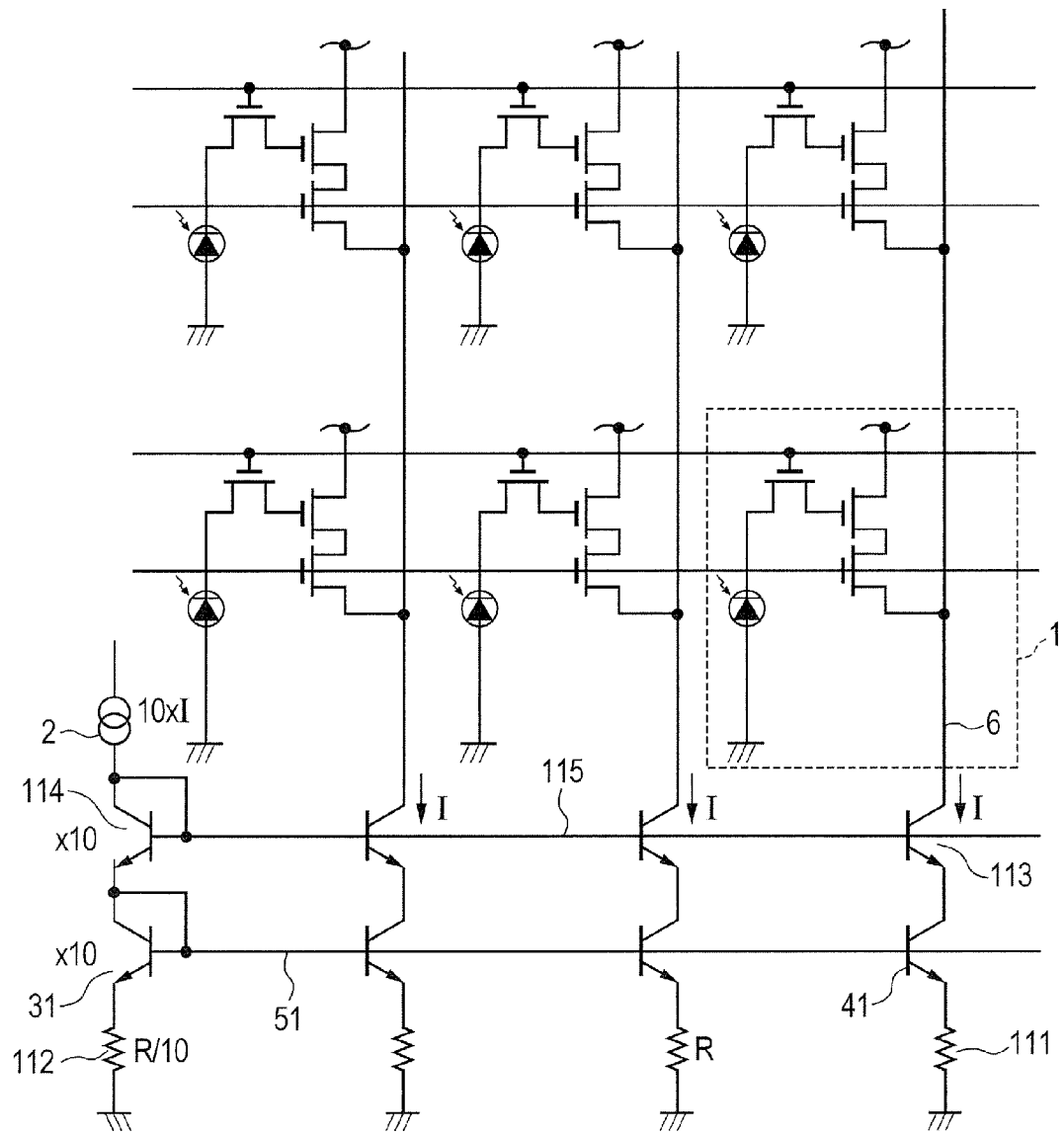
FIG. 7 is a circuit configuration diagram of a solid-state imaging apparatus of a fifth embodiment.

FIG. 7 is a circuit configuration diagram of a solid-state imaging apparatus of a fifth embodiment. Reference numerals 1, 2, 4, 5, and 6 denote the same components as in the first embodiment, and thus descriptions thereof will be omitted.

Bipolar transistors 31 and 41, emitter resistors 111 and 112, and a bias line are the same as in the second embodiment. Now, differences of this embodiment from the second embodiment will be described. A first current source circuit includes a first transistor 41, a first resistor 111, and also a third transistor 113. The third transistor 113 is a bipolar transistor having a collector node connected to a vertical signal line 6, and an emitter node connected to a collector node of the first transistor 41. A second current source circuit includes a first current source 2, a second transistor 31, a second resistor 112, and also a fourth transistor 114. The fourth transistor 114 is a bipolar transistor having a base node connected to a base node of the third transistor 113, and an emitter node connected to a collector node of the second transistor 31. The first current source 2 is connected to the collector and base nodes of the fourth transistor 114. Base and collector nodes of the second transistor 31 are mutually connected. The bipolar transistor 114 is added to a current generation portion, and the bipolar transistor 113 is added to a pixel current portion, that is, a grounded-base amplification circuit is added to suppress variations in collector potential of the bipolar transistor 41, and achieve a more stable current source circuit. Also in this case, the resistors 111 and 112 can relieve and suppress an influence of a ground line to obtain a desired current.

Sixth Embodiment

As expressed in Expression (1), a higher resistance value of a resistor Rs added to a source of the current source circuit achieves a larger advantage to provide a stable bias current. Sixth embodiment shows a case where the same advantage as when a resistor having a higher resistance value is added is achieved using a smaller layout area. In Expression (1), using Expression (6), an AC component vg of a gate voltage Vg can be resolved into an AC component vs of a voltage Vs of a source resistor Rs and an AC component vgs of a gate-source voltage Vgs.

Expression 6

$$v_g = v_{gs} + v_s \quad (6)$$

The AC component vs of the voltage Vs of the source resistor Rs is expressed by Expression (7) below.

Expression 7

$$v_s = R_s i_{out} \quad (7)$$

The AC component vgs of the gate-source voltage Vgs is expressed by Expression (8) below.

Expression 8

$$v_{gs} = \frac{i_{out}}{g_m} \quad (8)$$

FIG. 8A again illustrates the current source circuit used in the first to fifth embodiments. From Expression (6), a potential difference Vg between the ground and gate is resolved into the gate-source voltage Vgs and the voltage Vs of the source resistor Rs. Thus, even when the gate voltage Vg changes due to disturbance or the like, the source resistor Rs added to 1/gm relieves current variations. When there are a plurality of (n) current source circuits in parallel as in FIG. 8A, a source potential of all of the current source circuits is Vs. Thus, even if sources of the plurality of N-MOS transistors are connected as shown in FIG. 8B, there is no change in a voltage relation. This can be equivalently illustrated as in FIG. 8C.

Specifically, the AC component vs of the source voltage Vs is expressed by Expression (9) below.

Expression 9

$$v_s = (n \cdot i_{out})(R_s/n) = R_s i_{out} \quad (9)$$

Figure 8A:
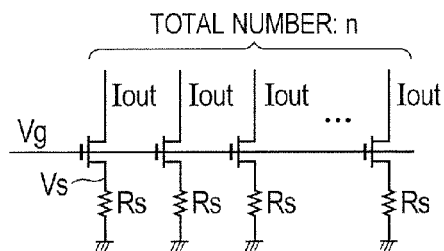
FIGS. 8A, 8B, 8C, 8D and 8E illustrate a concept of a sixth embodiment.
Figure 8B:
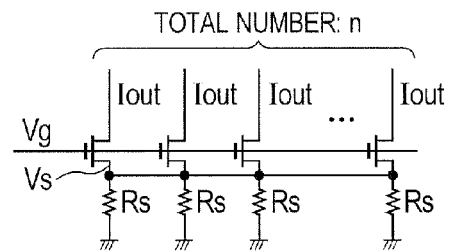
Figure 8C:
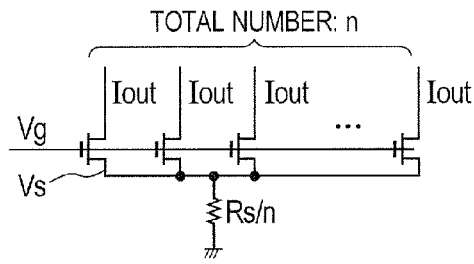

If the source voltage Vs is stored as in Expression (9), the same advantage as in FIG. 8A can be obtained in operation. It is found that when there are the plurality of current source circuits having the source resistors Rs, the same advantage can be obtained by integrating the resistors Rs. In other words, the resistor Rs is shared by the current source circuits in a plurality of pixel columns. A resistance value can be reduced in inverse proportion to the number of integrated resistors as compared to a single resistor. For example, if resistors Rs having a resistance value of 20 kΩ in 10 columns in the first embodiment are integrated, the resistance value of the resistor Rs is 1/10 and 2 kΩ, thereby reducing a layout area.

Figure 8D:
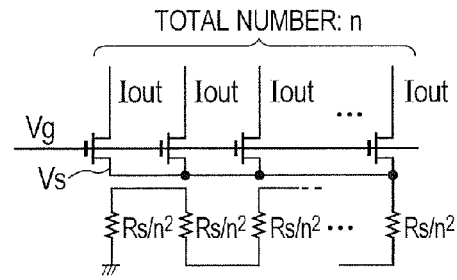
Figure 8E:
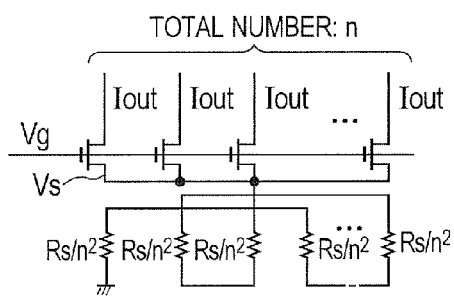

Further, as shown in FIG. 8D, the source resistor Rs is assigned to each column and connected in series, and thus the resistance value of the resistor Rs in each column may be $1/10^2$ and 200Ω. In view of balance of source nodes, a method of connecting a node of a source resistor to a middle in FIG. 8E is favorable. In any case, the resistance value of the source resistor can be reduced in inverse proportion to the square of the number of integrated resistors. When the resistors are integrated, a resistance value of a resistor of a wire for integration is sufficiently lower than that of a resistor added. All columns in the solid-state imaging apparatus do not need to be integrated together, but a plurality of blocks, each including a plurality of columns integrated, may be arranged.

Figure 9:
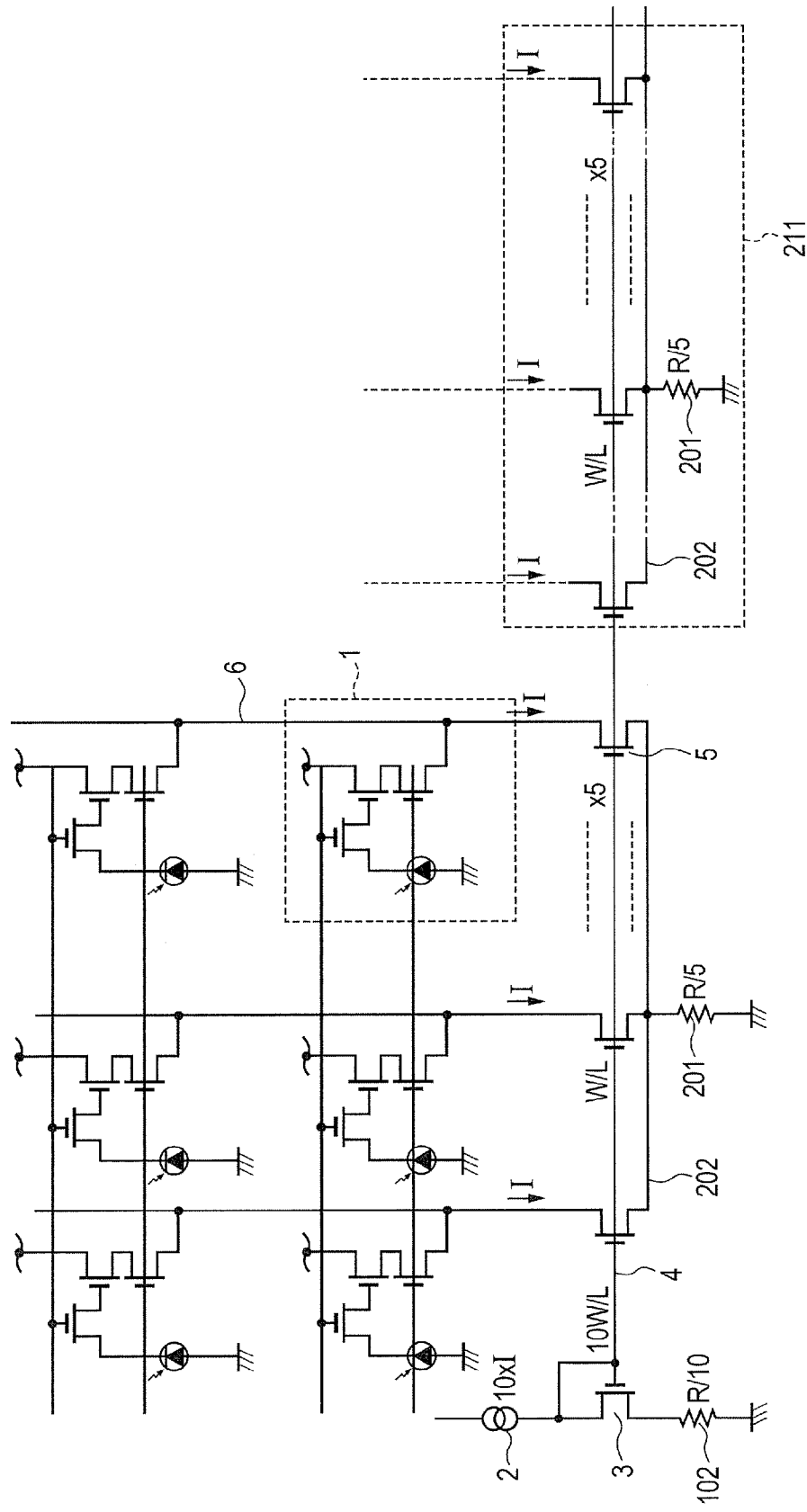
FIG. 9 is a circuit configuration diagram of a solid-state imaging apparatus of a sixth embodiment.

FIG. 9 illustrates a sixth embodiment of the present invention with design of the resistance value illustrated in FIGS. 8A to 8E applied to the solid-state imaging apparatus. In FIG. 9, an integrated source resistor 201, a common source 202, and an integrated current block 211 are illustrated. Every five first transistors 5, source nodes are mutually connected. The source nodes mutually connected are connected to the common source 202. The first resistor 201 is connected between the common source 202 and a reference voltage node. In this embodiment, all columns are divided every five columns to integrate a current, but the number of columns can be selected as long as it matches the second transistor 3 and the second resistor 102 in the current source circuit. A magnitude of the first transistor 5 is W/L as in the first, third and fourth embodiments. However, a resistance value of the source resistor 201 is R/5, which is 1/5 of that in the first to third embodiments. This is to provide the source electrode 202 having the same potential as the source potential of the second transistor 3.

Specifically, the source potential of the second transistor 3 is expressed by Expression (10) below.

Expression 10

$$10I \cdot \frac{R}{10} = IR \quad (10)$$

A current of 5×I is supplied from the five first transistors 5 to the resistor 201. Thus, to obtain a source potential of IR, the source resistor 201 is expressed by Expression (11) below, and a resistance value can be reduced in inverse proportion to the number of integrated resistors as described above.

Expression 11

$$\frac{I \cdot R}{5I} = \frac{R}{5} \quad (11)$$

For example, assuming that a potential of a source resistor having durability to disturbance or variations is generally 0.2

V or more, the resistance value of the source resistor 201 is 4 kΩ when I is about 10 μA in FIG. 9.

Seventh Embodiment

Figure 10:
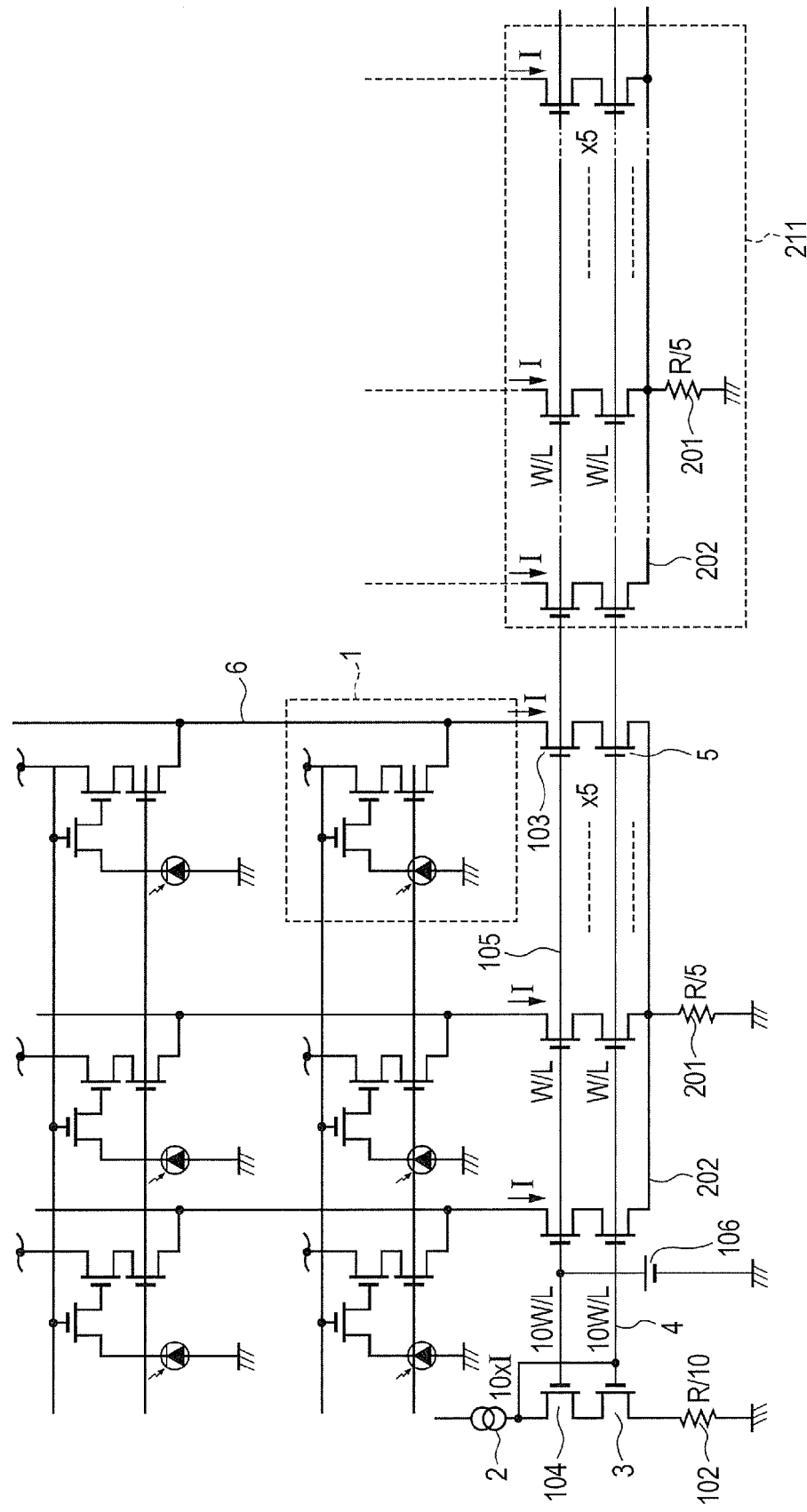
FIG. 10 is a circuit configuration diagram of a solid-state imaging apparatus of a seventh embodiment.

FIG. 10 is a circuit configuration diagram of a solid-state imaging apparatus of a seventh embodiment, which is the sixth embodiment applied to FIG. 5. Every five first transistors 5, source nodes are mutually connected. The source nodes mutually connected are connected to a common source 202. A first resistor 201 is connected between the common source 202 and a reference voltage node. An N-MOS transistor 103 receives a bias generated by a common gate voltage source 106 and a common gate amplification current source N-MOS transistor 104 to increase constant current properties.

Eighth Embodiment

Figure 11:
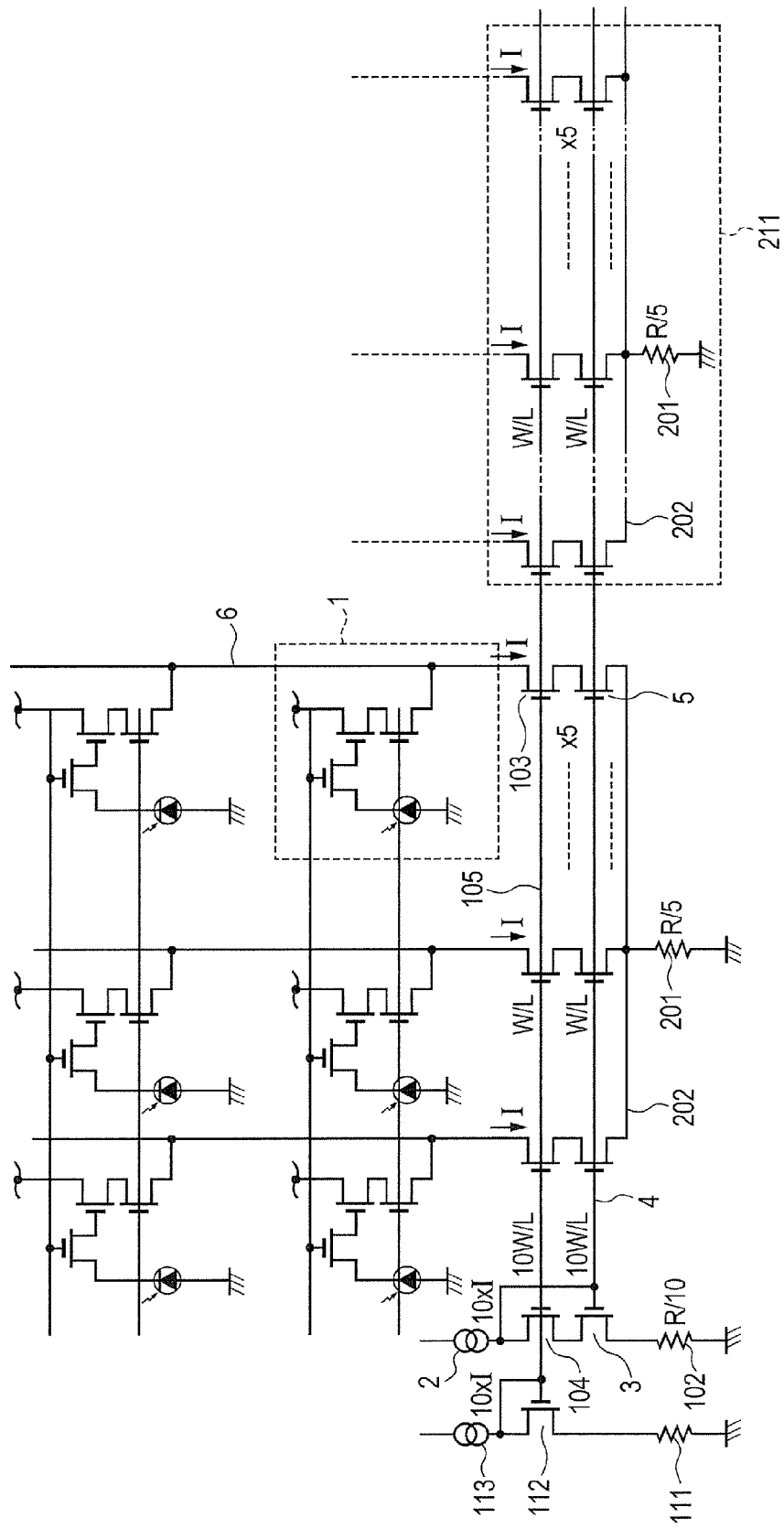
FIG. 11 is a circuit configuration diagram of a solid-state imaging apparatus of an eighth embodiment.

FIG. 11 is a circuit configuration diagram of a solid-state imaging apparatus of an eighth embodiment, which is the sixth embodiment applied to FIG. 6. Every five first transistors 5, source nodes are mutually connected. The source nodes mutually connected are connected to a common source 202. A first resistor 201 is connected between the common source 202 and a reference voltage node. A voltage generation portion is constituted by, as in FIG. 6, a current source 113, an N-MOS transistor 112, and a source resistor 111. Such a circuit configuration can increase durability to variations such as threshold variations or temperature variations.

Ninth Embodiment

Figure 12:
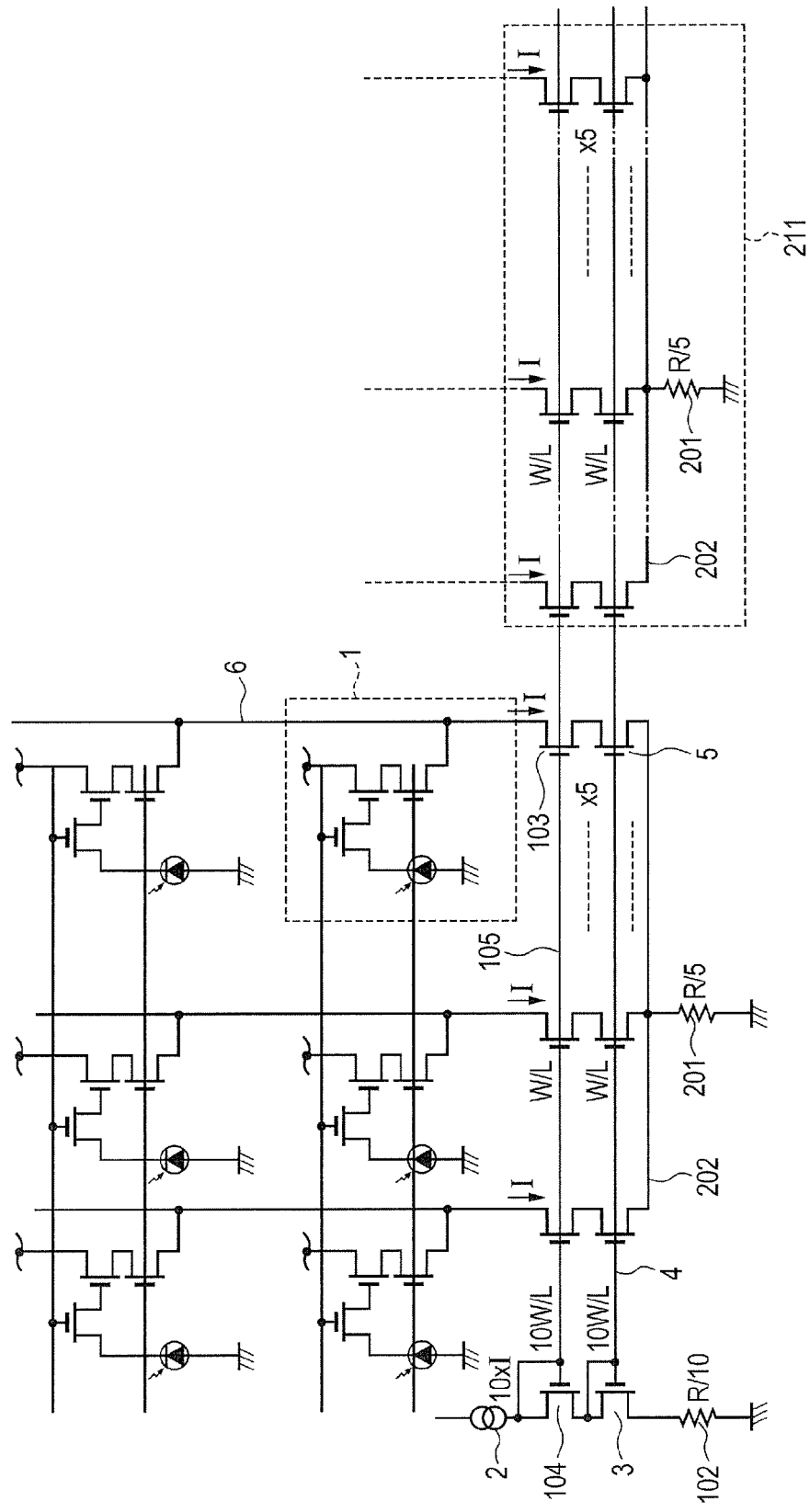
FIG. 12 is a circuit configuration diagram of a solid-state imaging apparatus of a ninth embodiment.

FIG. 12 illustrates a circuit configuration of a solid-state imaging apparatus of a ninth embodiment, with a voltage generation portion of another common gate circuit added to FIG. 10. As in FIG. 7, N-MOS transistors 3 and 104 have drains and gates mutually connected. A first current source circuit includes a first transistor 5, a first resistor 201, and also a third transistor 103. The third transistor 103 is an N-MOS transistor having a drain node connected to a vertical signal line 6, and a source node connected to a drain node of the first transistor 5. The second current source circuit includes a first current source 2, a second transistor 3, a second resistor 102, and also a fourth transistor 104. The fourth transistor 104 is an N-MOS transistor having a gate node connected to a gate node of the third transistor 103, and a source node connected to a drain node of the second transistor 3. The first current source 2 is connected to drain and gate nodes of the fourth transistor 104. The gate and drain nodes of the second transistor 3 are mutually connected. Every five first transistors 5, source nodes are mutually connected. The source nodes mutually connected are connected to a common source electrode 202. A first resistor 201 is connected between the common source electrode 202 and a reference voltage node. In this embodiment, an operating voltage range is narrower than in the eighth embodiment, but a current consumed by the current source is reduced.

Tenth Embodiment

Figure 13:
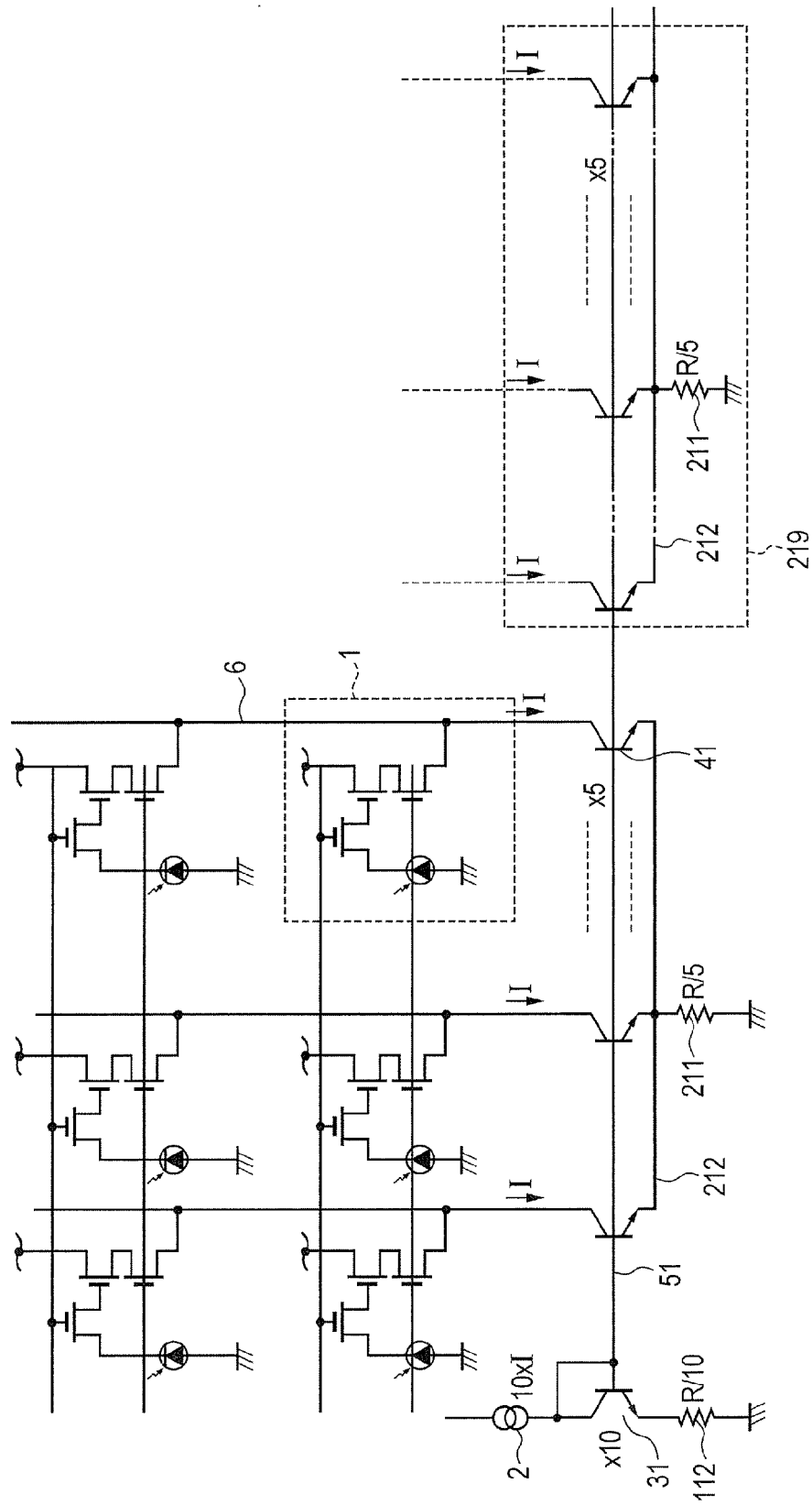
FIG. 13 is a circuit configuration diagram of a solid-state imaging apparatus of a tenth embodiment.

FIG. 13 is a circuit configuration diagram of a solid-state imaging apparatus of a tenth embodiment, and corresponds to FIG. 3. Even when a current source circuit includes bipolar transistors 31 and 41, an emitter resistor 211 is integrated to obtain a great advantage with a low resistance value. In FIG. 13, reference numerals 2, 31, 51, 112, 41 and 6 denote the same components as in the second embodiment, and descrip-tions thereof will be omitted. Every five first transistors 41, emitter nodes are mutually connected. The emitter nodes mutually connected are connected to a common emitter electrode 212. The first resistor 211 is connected between a common emitter electrode 212 and a reference voltage node. In a current block 219, five systems are integrated, and an emitter of the bipolar transistor 41 is shared by the common emitter electrode 212. The emitter is grounded from the common emitter electrode 212 through the emitter resistor 211, and a resistance value of the resistor 211 is ⅕ of that of a general emitter resistor. For the bipolar transistor, an emitter potential of 0.1 V provides a sufficient suppressing effect. Thus, when a current I supplied to a vertical signal line 6 is similarly 10 μA, a resistance value Re of the emitter resistor is Re=10 kΩ without integration, and Re (211)=2 kΩ with integration.

Eleventh Embodiment

Figure 14:
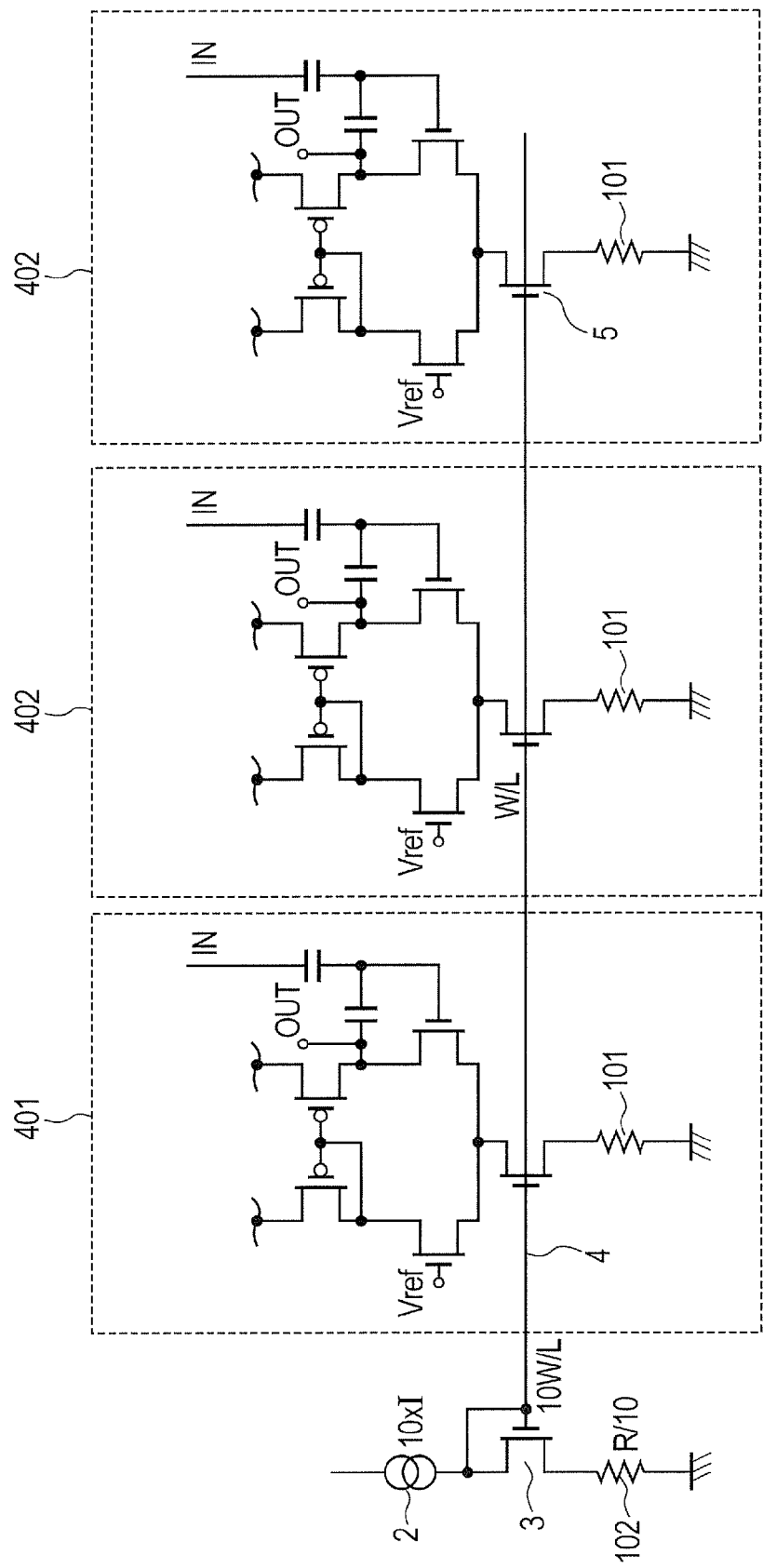
FIG. 14 is a circuit configuration diagram of a solid-state imaging apparatus of an eleventh embodiment.

The first to tenth embodiments all relate to a bias current of a load of a pixel source follower, but the present invention may be applied to an operational amplifier or the like provided in each pixel column. FIG. 14 is a circuit configuration diagram of a solid-state imaging apparatus including operational amplifiers 401 to 403 arranged in one dimension or two dimensions of an eleventh embodiment. In FIG. 14, the operational amplifiers 401, 402 and 403 are arranged in one dimension. Input terminals IN of the operational amplifiers 401 to 403 are respectively connected to the plurality of vertical signal lines 6 in FIG. 2.

As shown in FIG. 2, a plurality of pixels 1 each include a photoelectric conversion element 7 that performs photoelectric conversion. The operational amplifiers 401 to 403 amplify signals from the plurality of pixels 1. A first current source circuit includes a first transistor 5 and a first resistor 101, and supplies a bias current to the operational amplifiers 401 to 403. A second current source circuit includes a first current source 2, a second transistor 3, and a second resistor 102, and supplies a bias current. The first transistor 5 is an N-MOS transistor having a drain node connected to the operational amplifiers 401 to 403. The first resistor 101 is connected between a source node of the first transistor 5 and a reference voltage node. The second transistor 3 is an N-MOS transistor having a gate node connected to a gate node of the first transistor 5. The second resistor 102 is connected between a source node of the second transistor 3 and a reference voltage node. The first current source 2 is connected to drain and gate nodes of the second transistor 3. A current supplied by the second transistor (second current source circuit) 3 is M-times larger than a current supplied by the first transistor (first current source circuit) 5, and a resistance value of the second resistor 102 is 1/M of a resistance value of the first resistor 101.

The plurality of first transistors 5 and first resistors 101 are current source circuits that supply an operating current of the operational amplifiers 401 to 403. A current source 2 is provided. The second transistor 3 is an N-MOS transistor having a size ten times larger than an original size of a current mirror of the first transistor 5. The second resistor 102 is a source resistor of the second transistor 3. A gate voltage of the first transistor 5 depends on the first current source 2, and is transferred through the bias line 4 to the first transistor 5. When the same circuit is driven by the same bias line, fluctuations may occur at the same time to cause a stripe noise, which is unfavorable for an image. Using this embodiment significantly suppresses the fluctuations to reduce the stripe noise.

Twelfth Embodiment

Figure 15:
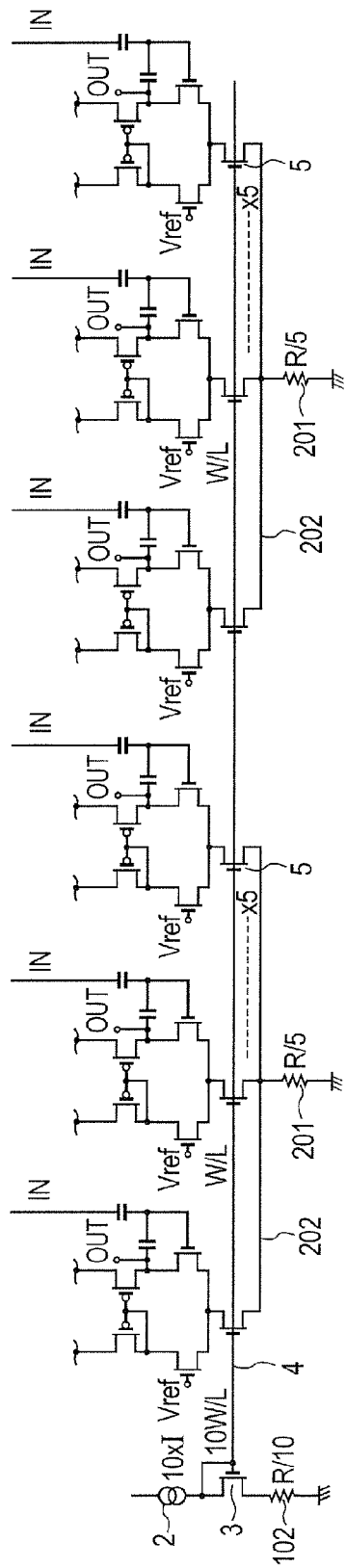
FIG. 15 is a circuit configuration diagram of a solid-state imaging apparatus of a twelfth embodiment.

FIG. 15 is a circuit configuration diagram of a solid-state imaging apparatus of a twelfth embodiment. In this embodiment, five current source circuits of operational amplifiers in the eleventh embodiment are integrated. Every five first transistors 5, source nodes are mutually connected. The source nodes mutually connected are connected to a common source electrode 202. A first resistor 201 is connected between the common source 202 and a reference voltage node. In the solid-state imaging apparatus, an amplifier using an operational amplifier is often arranged in each column, and in such a case, this embodiment is effective. In FIG. 15, reference numerals 2, 3, 4, and 102 denote the same components as in the eleventh embodiment, and descriptions thereof will be omitted. As in FIG. 9, sources of the first transistor 5 in current source circuits of five operational amplifiers are integrated by the common source 202, and grounded by the common source resistor 201. Thus, the same advantage as a current source circuit including a source resistor having a high resistance value can be obtained with a resistor having a relatively low resistance value, thereby preventing a stripe noise on an image and obtaining a satisfactory image.

As described above, the solid-state imaging apparatus is a one- or two-dimensional optical sensor such as a CMOS sensor having a source follower in each pixel. In this embodiment, the current source using the source resistor is used in the current source circuit, further the block is formed by connecting the sources, and the source resistor is added to the block. This can increase durability to induction due to disturbance or an increase in ground potential. This can prevent an unstable image such as with white stripe or smear of a horizontal direction, and obtain a more satisfactory image. Specifically, potential variations of the gate bias line 5 of the current source circuit of the vertical signal line 6 due to disturbance such as electromagnetic induction can be prevented to suppress variations in drive current due to an increase in ground potential of the current source circuit. This can reduce problems such as shading or white stripe or smear of a horizontal direction in an image obtained by the solid-state imaging apparatus.

In the first to twelfth embodiments, the transistor may be an MOS transistor or a bipolar transistor. In this case, the gate, drain, and source nodes of the MOS transistor correspond to the base, collector, and emitter nodes, respectively, of the bipolar transistor. The second to tenth embodiments can be also applied to the current source circuit connected to the operational amplifiers 401 to 403 in the eleventh and twelfth embodiments.

All the above-described embodiments merely show examples for carrying out the present invention, and the technical scope of the present invention should not be construed in a limited manner by the embodiments. Specifically, the present invention can be carried out in various manners without departing from the technical idea or essential features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-264512, filed Dec. 2, 2011, which is hereby incorporated by reference herein in its entirety.

What is claimed is:

1. A solid-state imaging apparatus comprising:
a plurality of pixels each including a photoelectric conversion element;
a signal line to which the plurality of pixels output signals;
a first current source circuit configured to supply a current to the signal line, the first current source circuit including a first transistor having a drain or collector node capable of being connected electrically to the signal line, a first resistor electrically connected between a reference voltage node and a source or emitter node of the first transistor, and a second transistor having a drain or collector node electrically connected to the signal line and having a source or emitter node electrically connected to the drain or collector node of the first transistor; and
a second current source circuit including a third transistor having a gate or base node being connected electrically to a gate or base node of the first transistor, a second resistor electrically connected between a reference voltage node and a source or emitter node of the third transistor, a fourth transistor having a gate or based node electrically connected to the gate or base node of the second transistor, and having a source or emitter node electrically connected to the drain or collector node of the third transistor, and a first current source electrically connected to the gate or base node of the third transistor and to the drain or collector node of the fourth transistor.

2. The solid-state imaging apparatus according to claim 1, wherein
a current supplied by the second current source circuit is M-times larger than a current supplied by the first current source circuit, and
a resistance value of the second resistor is 1/M of a resistance value of the first resistor.

3. The solid-state imaging apparatus according to claim 1, wherein the second current source circuit has a current source electrically connected to a drain or collector node and to the gate or base node of the third transistor.

4. The solid-state imaging apparatus according to claim 1, further comprising a voltage source electrically connected to the gate or base node of the fourth transistor.

5. The solid-state imaging apparatus according to claim 1, further comprising
a fifth transistor having a drain or collector node electrically connected to the second current source, and having a gate or base node electrically connected to the second current source and to the gate or base node of the fourth transistor, and
a third resistor electrically connected between the reference voltage node and a source or base node of the fifth transistor.

6. The solid-state imaging apparatus according to claim 1, wherein
the plurality of pixels are arranged in a matrix,
the signal line is connected to each column of the plurality of pixels,
a plurality of the first transistors are electrically connected each one to each one of a plurality of the signal lines,
the source and emitter nodes of each of the plurality of the first transistors are mutually connected electrically, and
the first resistor is connected between the mutually connected source and emitter and the reference voltage node.

7. A solid-state imaging apparatus comprising:
a plurality of pixels each including a photoelectric conversion element;
a signal line to which the plurality of pixels output signals;

a first current source circuit configured to supply a current to the signal line, the first current source circuit including a first transistor having a drain or collector node capable of being connected electrically to the signal line, a first resistor electrically connected between a reference voltage node and a source or emitter node of the first transistor, and a second transistor having a drain or collector node electrically connected to the signal line and having a source or emitter node electrically connected to the drain or collector node of the first transistor; and a second current source circuit including a third transistor having a gate or base node being connected electrically to a gate or base node of the first transistor, and a second resistor electrically connected between a reference voltage node and a source or emitter node of the third transistor, a fourth transistor having a gate or based node electrically connected to the gate or base node of the second transistor and having a source or emitter node electrically connected to the drain or collector node of the third transistor, and to the gate or base node of the third transistor, and a current source electrically connected to the gate or base node of the fourth transistor and to the drain or collector node of the fourth transistor.

8. A solid-state imaging apparatus comprising:

a plurality of pixels each including a photoelectric conversion element;

an amplifier configured to amplify signals from the plurality of pixels;

a signal line to which the plurality of pixels output the signals;

a first current source circuit configured to supply a current to the signal line, the first current source circuit including a first transistor having a drain or collector node capable of being connected electrically to the signal line, and a first resistor electrically connected between a reference voltage node and a source or emitter node of the first transistor, and a second transistor having a drain or collector node electrically connected to the amplifier and having a source or emitter node electrically connected to the drain or collector node of the first transistor; and a second current source circuit including a third transistor having a gate or base node being connected electrically to a gate or base node of the first transistor, and a second resistor electrically connected between a reference voltage node and a source or emitter node of the third transistor, a fourth transistor having a gate or based node electrically connected to the gate or base node of the second transistor and having a source or emitter node electrically connected to the drain or collector node of the third transistor, and a first current source electrically connected to the gate or base node of the third transistor and to the drain or collector node of the fourth transistor.

9. The solid-state imaging apparatus according to claim 8, wherein a current supplied by the second current source circuit is M-times larger than a current supplied by the first current source circuit, and a resistance value of the second resistor is 1/M of a resistance value of the first resistor.

10. The solid-state imaging apparatus according to claim 8, wherein the second current source circuit has a current source electrically connected to a drain or collector node and to the gate or base node of the third transistor.

11. The solid-state imaging apparatus according to claim 8, further comprising a voltage source electrically connected to the gate or base node of the fourth transistor.

12. The solid-state imaging apparatus according to claim 8, further comprising a fifth transistor having a drain or collector node electrically connected to the second current source, and having a gate or base node electrically connected to the second current source and to the gate or base node of the fourth transistor, and a third resistor electrically connected between the reference voltage node and a source or base node of the fifth transistor.

13. The solid-state imaging apparatus according to claim 8, wherein the plurality of pixels are arranged in a matrix, the amplifier is connected to each column of the plurality of pixels, a plurality of the first transistors are electrically connected each one to each one of a plurality of the amplifiers, the source and emitter nodes of each of the plurality of the first transistors are mutually connected electrically, and the first resistor is connected between the mutually connected source and emitter and the reference voltage node.

14. A solid-state imaging apparatus comprising:

a plurality of pixels each including a photoelectric conversion element;

an amplifier configured to amplify signals from the plurality of pixels;

a signal line to which the plurality of pixels output the signals;

a first current source circuit configured to supply a current to the signal line, the first current source circuit including a first transistor having a drain or collector node capable of being connected electrically to the signal line, a first resistor electrically connected between a reference voltage node and a source or emitter node of the first transistor, and a second transistor having a drain or collector node electrically connected to the amplifier and having a source or emitter node electrically connected to the drain or collector node of the first transistor, and a second current source circuit including a third transistor having a gate or base node being connected electrically to a gate or base node of the first transistor, a second resistor electrically connected between a reference voltage node and a source or emitter node of the third transistor, a fourth transistor having a gate or based node electrically connected to the gate or base node of the second transistor and having a source or emitter node electrically connected to the drain or collector node of the third transistor and to the gate or base node of the third transistor, and a current source electrically connected to the gate or base node of the fourth transistor and to the drain or collector node of the fourth transistor.

* * * * *